(12) United States Patent
Matz et al.

(10) Patent No.: US 8,202,808 B2
(45) Date of Patent: Jun. 19, 2012

(54) METHODS OF FORMING STRONTIUM TITANATE FILMS

(75) Inventors: Laura M. Matz, Allentown, PA (US);
Xiangxin Rui, San Jose, CA (US);
Xinjian Lei, Vista, CA (US); Sunil Shanker, Santa Clara, CA (US);
Moo-Sung Kim, Seongnam (KR); Iain Buchanan, Cambusbarron (GB)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 12/793,611

(22) Filed: Jun. 3, 2010

(65) Prior Publication Data

US 2011/0027960 A1 Feb. 3, 2011

Related U.S. Application Data

(60) Provisional application No. 61/183,889, filed on Jun. 3, 2010.

(51) Int. Cl.
*H01L 21/285* (2006.01)

(52) U.S. Cl. ................... 438/785; 257/E21.16; 438/381

(58) Field of Classification Search .................. 438/381, 438/785; 257/E21.16, E21.003; 428/701
See application file for complete search history.

(56) References Cited

U.S. PATENT DOCUMENTS

| | | | |
|---|---|---|---|
| 7,115,166 B2 * | 10/2006 | Vaartstra et al. | 117/86 |
| 2008/0118731 A1 * | 5/2008 | Srinivasan et al. | 428/220 |
| 2008/0194088 A1 * | 8/2008 | Srinivasan et al. | 438/584 |
| 2010/0072531 A1 * | 3/2010 | Kittl et al. | 257/296 |
| 2010/0075067 A1 * | 3/2010 | Kim et al. | 427/576 |
| 2010/0258903 A1 * | 10/2010 | Srinivasan et al. | 257/532 |
| 2011/0014797 A1 * | 1/2011 | Kawano et al. | 438/785 |

* cited by examiner

*Primary Examiner* — William D Coleman
*Assistant Examiner* — Christine Enad

(57) ABSTRACT

Embodiments of the current invention include methods of forming a strontium titanate ($SrTiO_3$) film using atomic layer deposition (ALD). More particularly, the method includes forming a plurality of titanium oxide ($TiO_2$) unit films using ALD and forming a plurality of strontium oxide (SrO) unit films using ALD. The combined thickness of the $TiO_2$ and SrO unit films is less than approximately 5 angstroms. The $TiO_2$ and SrO units films are then annealed to form a strontium titanate layer.

13 Claims, 14 Drawing Sheets

|     |      |           |           | Predicted Range of      | Using actual Depn   |
|-----|------|-----------|-----------|-------------------------|---------------------|
| 505 | Set# | Ti Cycles | Sr Cycles | Stochiometry (Sr/Sr+Ti) | rates Sr/(Sr+Ti)    |
|     |      | 2         | 3         | 0.560                   | 0.554               |
|     |      | 4         | 6         | 0.560                   | 0.554               |
|     | 1a   | 8         | 12        | 0.560                   | 0.554               |
|     |      | 16        | 24        | 0.560                   | 0.554               |
| 506 |      | 32        | 48        | 0.560                   | 0.554               |
|     |      | 3         | 4         | 0.532                   | 0.527               |
|     |      | 2         | 4         | 0.644                   | 0.636               |
|     |      | 5         | 6         | 0.510                   | 0.505               |
| 507 | 1b   | 6         | 8         | 0.532                   | 0.527               |
|     |      | 15        | 20        | 0.532                   | 0.527               |
|     |      | 27        | 36        | 0.532                   | 0.527               |
|     |      | 30        | 10        | 0.365                   | 0.364               |
| 508 | 2    | 17        | 17        | 0.477                   | 0.472               |
|     |      | 17        | 20        | 0.506                   | 0.501               |
|     |      | 3         | 1         | 0.365                   | 0.364               |
|     |      | 60        | 20        | 0.365                   | 0.364               |
|     | 3    | 7         | 21        | 0.811                   | 0.799               |
|     |      | 4         | 24        | 1.312                   | 1.288 **            |
|     |      | 24        | 12        | 0.393                   | 0.391               |

Labels: 503, 504, 501, 502

Figure 5

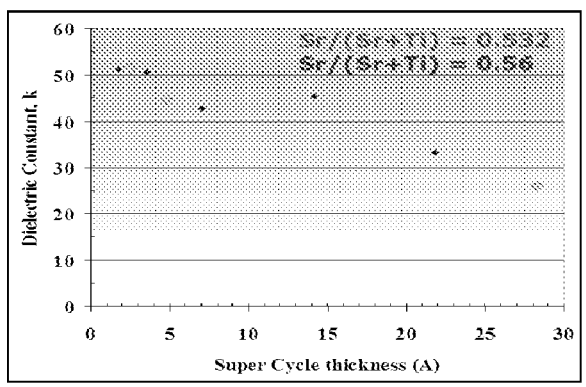
Figure 6A
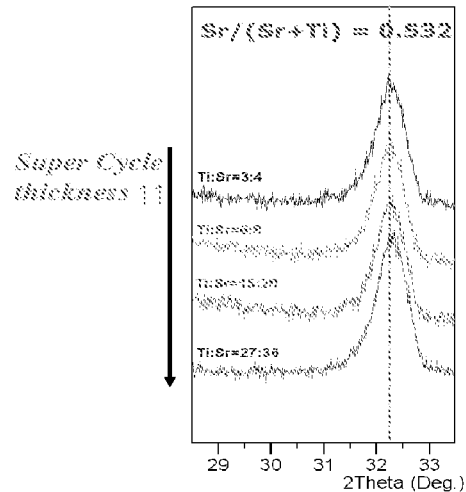
Figure 6B
| | Thkn (nm) | Jav at 1.0V | EOT (nm) | K | Yield (Out of 36) |
|---|---|---|---|---|---|
| 3:4 | 14.3 | 4.41E-06 | 1.05 | 53.10 | 17 |
| 6:8 | 13.7 | 3.06E-05 | 1.00 | 53.07 | 14 |
| 4:6 | 14.5 | 1.57E-06 | 1.04 | 54.67 | 33 |
| 8:12 | 13.95 | 5.3E-06 | 0.99 | 55 | 7 |
| 3:5 | 14.0 | 1.32E-06 | 1.15 | 47.33 | 22 |
| 6:10 | 13.68 | 1.06E-05 | 1.05 | 50.76 | 19 |
| 4:7 | 15.0 | 1.08E-06 | 1.15 | 50.96 | 30 |
| 8:14 | 15.0 | 3.74E-06 | 1.10 | 53.22 | 12 |
Figure 6C

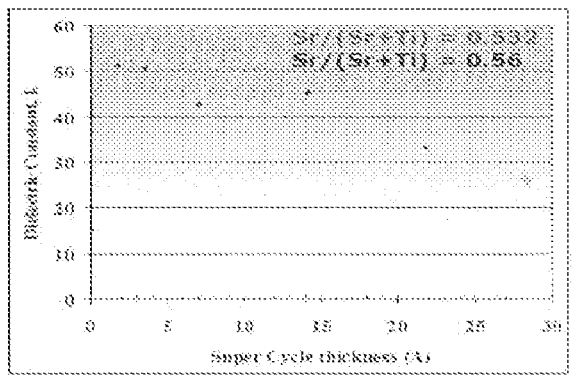
Figure 8A
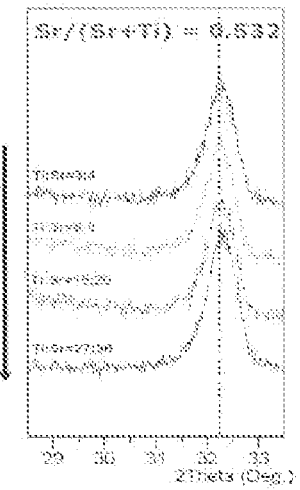
Figure 8B
Figure 8C

| HfSi | Condition | RTN (O) | Thk a (nm) | J @1V (A/cm2) | EOT (nm) | k | Yield (out of 36) |
|---|---|---|---|---|---|---|---|
| 4:6 | 50 Sr satn. pulses | 600 / 5min | 11 8 | 1.87E-07 | 0.75 | 61 | 35 |
| 4:6 | 100 Sr satn. pulses | 600 / 5min | 11 6 | 2.60E-08 | 0.78 | 58 | 23 |

Figure 13

METHODS OF FORMING STRONTIUM TITANATE FILMS

FIELD OF THE INVENTION

The present invention relates generally to semiconductor processing. More specifically, methods of forming high dielectric constant films using atomic layer deposition are described.

BACKGROUND OF THE INVENTION

Industry continues to search for new semiconductor materials that exhibit a high dielectric constant and low leakage to enable further miniaturization of electronic technologies. Such materials for example may be used as the dielectric layer in electronic components such as capacitors, memory cell structures, and other types of electronic components. But, most materials investigated to date exhibit either high dielectric constant and high leakage, or low dielectric constant and low leakage. Therefore, industry has turned to investigating combinations of these materials in order to develop materials with the requisite properties. Strontium titanate ($SrTiO_3$) is one such material that is being investigated for having a high dielectric constant and low leakage.

BRIEF DESCRIPTION OF THE DRAWINGS

Various embodiments of the invention are disclosed in the following detailed description and the accompanying drawings:

FIG. 5 is a chart showing the results of a study of strontium titanate film compositions having various ALD supercycle thicknesses and ratios;

FIG. 6A is a graph showing the relationship between the ALD supercycle thicknesses and the dielectric constant values in strontium titanate films;

FIG. 6B is a comparison of x-ray crystallography data of strontium titanate films having varied supercycle thicknesses but the same composition;

FIG. 6C is a chart showing the data for multiple strontium titanate films having varied strontium oxide to titanium oxide ratios of supercycle thicknesses and the related leakage density, dielectric constant (k), and effective oxide thickness (EOT) values for each film;

FIG. 8 is a contour plot of dielectric constant values for strontium titanate films having varied supercycle thicknesses and varied compositions;

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Embodiments of the current invention include methods of forming a strontium titanate ($SrTiO_3$) film using atomic layer deposition (ALD). More particularly, the method includes forming a plurality of strontium oxide (SrO) unit films using ALD and forming a plurality of titanium oxide ($TiO_2$) unit films using ALD. The combined thickness of the SrO and $TiO_2$ unit films is less than approximately 5 angstroms. The SrO and $TiO_2$ units films are then annealed to form a strontium titanate layer. This anneal may occur before the deposition of any other material over the SrO and $TiO_2$ unit films. The strontium titanate layer formed by these methods and others described herein may have an increased dielectric constant and an improved electrical leakage value (J). In embodiments, the strontium titanate film may be the dielectric layer of a capacitive device.

Figure 1:
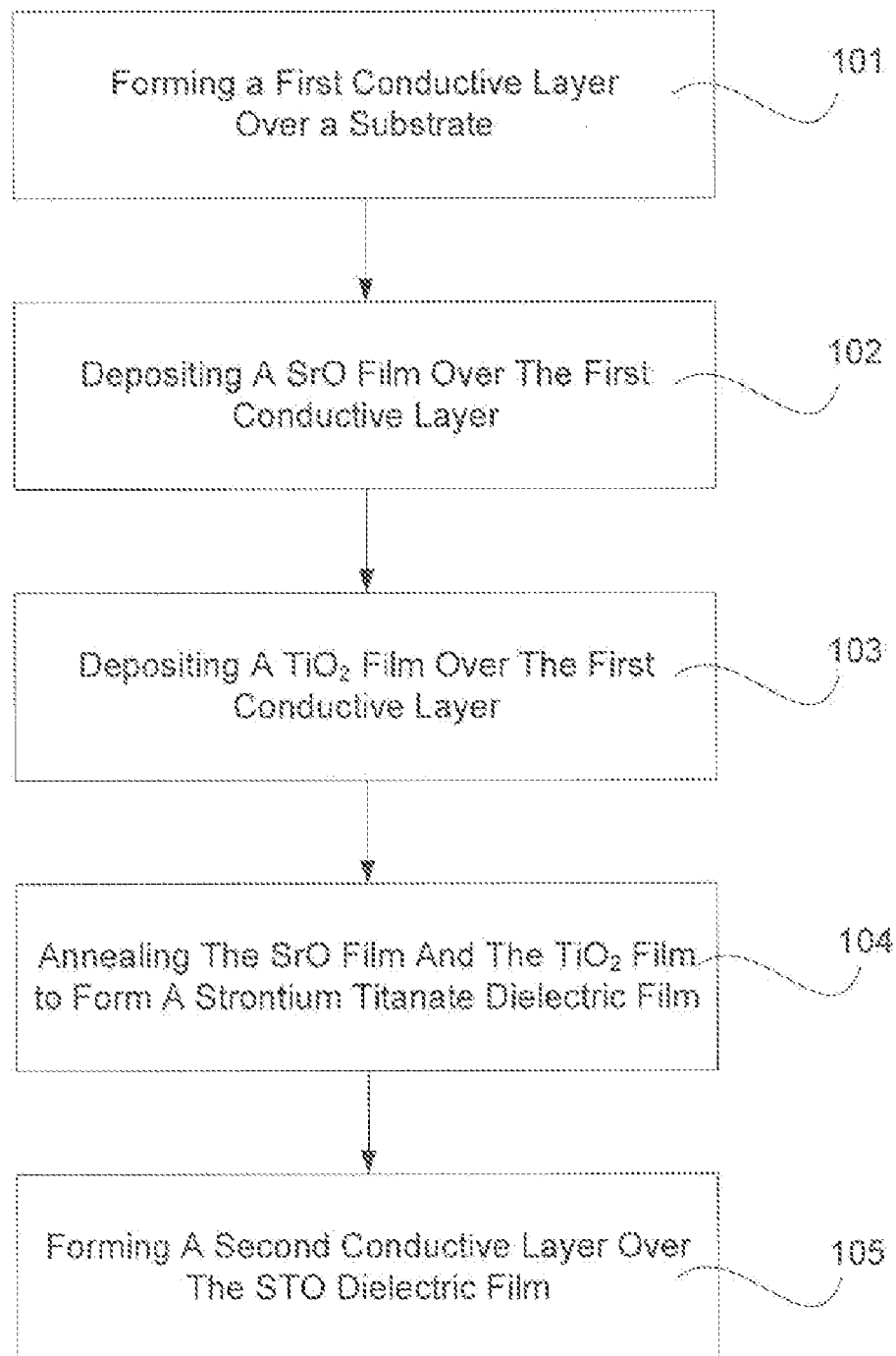
FIG. 1 is a flowchart describing a method of forming a capacitive device including forming a strontium titanate film.

FIG. 1 illustrates a flowchart describing an embodiment of forming a capacitive device that includes a strontium titanate dielectric film. At block 101 of FIG. 1 a first conductive layer 405 is formed over a substrate 403, as illustrated in FIG. 4. The first conductive layer 405 may be a material such as titanium nitride (TiN), platinum, iridium, iridium oxide, tungsten, tungsten oxide, molybdenum, molybdenum oxide, ruthenium and ruthenium oxide that are often used as the electrode materials of dynamic random access memory (DRAM) cells.

In an embodiment, a strontium oxide (SrO) film 410 may then be deposited over the first conductive layer 405 at block 102. In this particular embodiment, SrO is deposited on the first conductive layer before the deposition of titanium oxide because experimental data have shown that depositing SrO first may lower the leakage density of the ultimately formed strontium titanate film, as will be shown later in the experimental results section. The SrO film 410 may be deposited by a vapor deposition method such as atomic layer deposition (ALD) or chemical vapor deposition (CVD). The flowchart of FIG. 2 describes forming a plurality of SrO unit films using ALD or CVD. At block 201 of FIG. 2 a plurality of SrO unit films are deposited using atomic layer deposition (ALD) or CVD. The strontium oxide unit films are formed as described in blocks 301 and 302 of the flowchart of FIG. 3 by forming at block 301 a strontium-containing monolayer on a substrate by pulsing a strontium precursor over a substrate and at block 302 by oxidizing said strontium containing monolayer by pulsing an oxygen containing source over the substrate. The oxygen containing source may be selected from the list including ozone, oxygen, plasma activated oxygen, and water.

At block 301 a strontium (Sr)-containing monolayer is formed by pulsing a Sr precursor over the substrate. In embodiments of the current invention, the strontium-containing precursors may be polydentate β-ketoiminates which are found, for example, in co-pending application US20070248754A1, U.S. Ser. No. 11/945,678 filed on Nov. 27, 2007, co-pending application U.S. Ser. No. 12/266,806 which was filed on Nov. 11, 2008, and co-pending application or U.S. Ser. No. 12/245,196 which was filed on Oct. 3, 2008. In certain embodiments, the polydentate β-ketoiminates may incorporate an alkoxy group in the imino group. The polydentate β-ketoiminates are selected from the group represented by the following Structure A.

Structure A is defined as

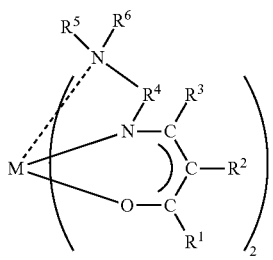

A wherein M is Strontium; $R^1$ is selected from the group consisting of alkyl, fluoroalkyl, cycloaliphatic, having from 1 to 10 carbon atoms, preferably a group containing 1 to 6 carbon atoms, and an aryl group having from 6 to 12 carbon atoms; $R^2$ is selected from the group consisting of hydrogen, alkyl, alkoxy, cycloaliphatic, having from 1 to 10 carbon atoms, preferably a group containing 1 to 6 carbon atoms, and an aryl group having from 6 to 12 carbon atoms; $R^3$ is selected from the group consisting of alkyl, fluoroalkyl, cycloaliphatic, having from 1 to 10 carbon atoms, preferably a group containing 1 to 6 carbon atoms, and an aryl group having from 6 to 12 carbon atoms; $R^4$ is a $C_{2-3}$ linear or branched alkylene bridge with or without chiral carbon atom, thus making a five- or six-membered coordinating ring to the metal center; $R^{5-6}$ are individually selected from the group consisting of alkyl, fluoroalkyl, cycloaliphatic, having from 1 to 10 carbon atoms, preferably a group containing 1 to 6 carbon atoms, and an aryl group having from 6 to 12 carbon atoms, and they can be connected to form a ring containing carbon, oxygen, or nitrogen atoms.

The temperature of the substrate during deposition of the strontium precursor may be in the approximate range of 290° C. and 310° C., and more particularly approximately 300° C. This temperature range is selected because it is the temperature window within which the deposition of the strontium precursor is optimal. The Sr-precursor can be delivered to the deposition chamber using vapor draw (with or without charging up), bubbling, or direct liquid injection. A carrier gas may be used to deliver the Sr-precursor. The choice of delivery system typically depends on the particular ALD deposition tool. The Sr-precursor is pulsed into the ALD reaction chamber for a time sufficient to form a monolayer or less of the Sr-precursor material on the substrate. The absorption of the precursor on the substrate is self-limiting, so under ALD process mode conditions the absorption should stop once the monolayer or less of the precursor material has formed on the surface. In an embodiment, the pulse time for the Sr-precursor to form one monolayer on the substrate may vary from tool to tool, precursor delivery method, substrate temperature, and similar factors. For example, the pulse time may be approximately one second on a Cambridge NanoTech atomic layer deposition tool (Savannah) with 20 SCCM Argon carrier gas at 300° C. The pulsing of the Sr-precursor may be followed by a purge by an inert gas such as Argon. In one particular embodiment, using the Cambridge NanoTech ALD tool described above, the purge may be a five second argon purge.

This class of strontium precursors have been found not to incorporate detectable amounts of carbon in the films. Without being bound by theory, it is postulated that with these precursors the Sr ligand bonds are completely oxidized during exposure to an oxygen containing source such as ozone or oxygen. The oxidation in the flow occurs at block 302 of the flowchart of FIG. 3. At block 302 a strontium oxide (SrO) unit film is formed by reacting the Sr-containing monolayer with ozone as the oxidizer. The use of ozone is practical and cost-effective because an exotic oxidizer is not needed. The forming of the SrO film is then repeated to form multiple layers of the SrO film during the ALD supercycle. An ALD supercycle is when more than one unit film is layered to obtain a particular thickness of material. For example, in FIG. 4A the multiple layers of the SrO unit films 411, 412, 413, 414, 415, and 416 may be in the form of a film stack 410.

In an embodiment, the deposition of the strontium monolayer may include multiple pre-saturation pulses. The pre-saturation pulses may be performed during only the first Sr-precursor deposition of SrO film 411 over the first conductive layer 405. The number of pre-saturation pulses may be in the approximate range of 50-200 pulses in a Cambridge NanoTech atomic layer deposition tool (Savannah). Experimental results of embodiments of the current invention support this claim.

At block 103 of the flowchart in FIG. 1 a titanium oxide ($TiO_2$) film is also deposited over the conductive layer. The $TiO_2$ may also be deposited by the method described in the flowchart of FIG. 2 at block 202 by forming a plurality of $TiO_2$ films using ALD. More specifically, the ALD deposition may occur as described in FIG. 3 at blocks 304 and 305. At block 304 a Ti-containing monolayer is formed on the substrate by pulsing a Ti precursor over the substrate. The Ti precursor may be chosen from the family of liquid group 4 precursors are represented by the following formula I:

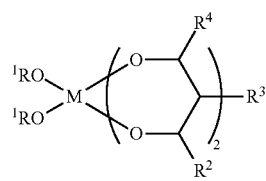

11

In formula I above, M comprises Ti; $R^1$ is an alkyl group comprising from 1 to 10 carbon atoms; $R^2$ is an alkyl group comprising from 1 to 10 carbon atoms; $R^3$ is chosen from hydrogen or an alkyl group comprising from 1 to 3 carbon atoms; $R^4$ is an alkyl group comprising from 1 to 6 carbon atoms.

In a particular embodiment, the titanium precursor (Ti-precursor) may be described as Ti-1, a precursor in which the titanium atom is coordinated with 2 tert-butoxy groups and 2 unsymmetrical beta-diketonato resulting in a preferred coordination number of 6 for Ti atom. The substrate may be a conductive layer such as an electrode described above in relation to the SrO deposition or the substrate may be one or more layers of the previously deposited SrO films. The temperature of the substrate may be in the approximate range of 250° C. and 400° C., and more particularly in the approximate range of 290° C. and 310° C., and even more particularly approximately 300° C. This temperature range is selected because it is the temperature within which the deposition of this class titanium precursor, and in particular Ti-1, is optimal. The Ti-precursor can be delivered to the deposition chamber using vapor draw (with or without charging up), bubbling, or direct liquid injection. A carrier gas may be used to deliver the Ti-precursor. The choice of delivery system typically depends on the particular ALD deposition tool. The Ti-precursor is pulsed into the ALD reaction chamber for a time sufficient to form a monolayer or less of the Ti-precursor material on the substrate. The absorption of the precursor on the substrate is self-limiting, so under optimized process conditions the absorption should stop once the monolayer or less of the precursor material has formed on the surface. In an embodiment, the pulse time for the Ti-precursor to form one monolayer on the substrate may vary from tool to tool, precursor delivery method, substrate temperature, and similar factors. For example, the pulse time may be approximately one second on a Cambridge NanoTech atomic layer deposition tool (Savannah) with 20 SCCM Argon carrier gas at 300° C. The pulsing of the Ti-precursor may be followed by a purge of an inert gas such as Argon. In one particular embodiment the purge may be a five second argon purge on the Cambridge NanoTech ALD tool described above.

In an embodiment, there may be multiple pre-saturation pulses of the Ti-1 precursor before the deposition of the first $TiO_2$ unit film, particularly in the instance where the Ti-1 precursor is deposited directly on an electrode. This may have an effect on the formation of the intermediate layer between the electrode and the $TiO_2$ film which may reduce the overall leakage of the strontium titanate film that is ultimately formed. Experimental results of embodiments of the current invention support this claim.

Figure 3:
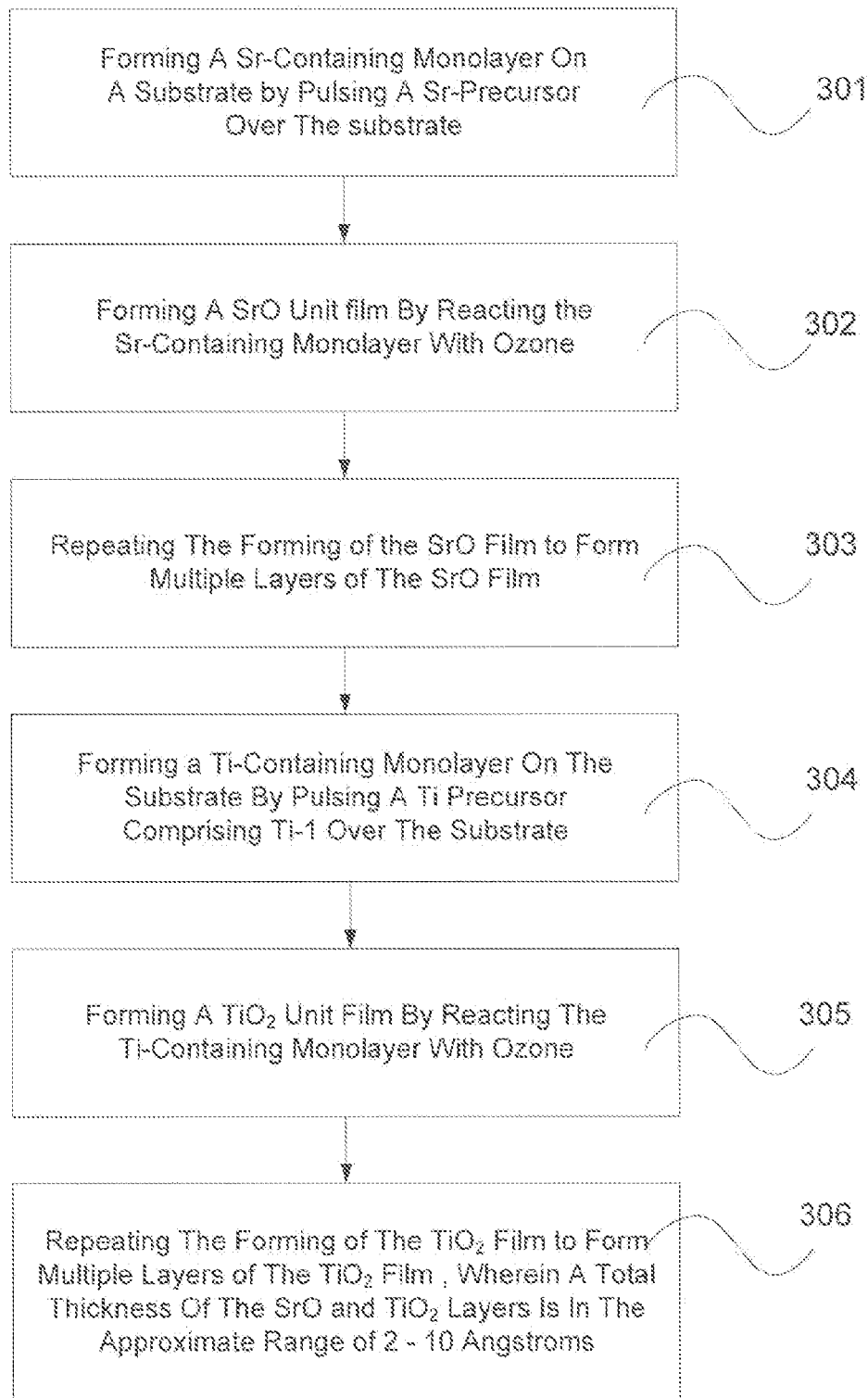
FIG. 3 is a flowchart describing a method of forming layers by atomic layer deposition, according to one embodiment of the current invention.

At block 305 of FIG. 3 a $TiO_2$ unit film is formed by reacting the titanium containing monolayer with ozone ($O_3$) as the oxidizer. In an embodiment, the temperature of the substrate is maintained at the same temperature as the deposition of the Ti-precursor monolayer. Ozone is pulsed into the ALD deposition chamber for a time sufficient to oxidize all of the titanium atoms in the Ti-containing monolayer. As described above for the formation of the Ti-precursor monolayer, the oxidation reaction is self-limiting and therefore under the optimized conditions will not continue reacting once all of the titanium precursor molecules have been oxidized. In one particular embodiment, the ozone is flowed into the deposition chamber for a pulse time of approximately 1 second followed an approximately 5 second argon purge. The Ti-1 precursor and ozone may be selected to form the $TiO_2$ film because they are compatible and ozone is a practical and cost effective oxidizer. Additionally, as will be in the Experimental Results section, the combination of the Ti-1 precursor and ozone may also lower the carbon content of the ultimately formed strontium titanate film.

Figure 4A:
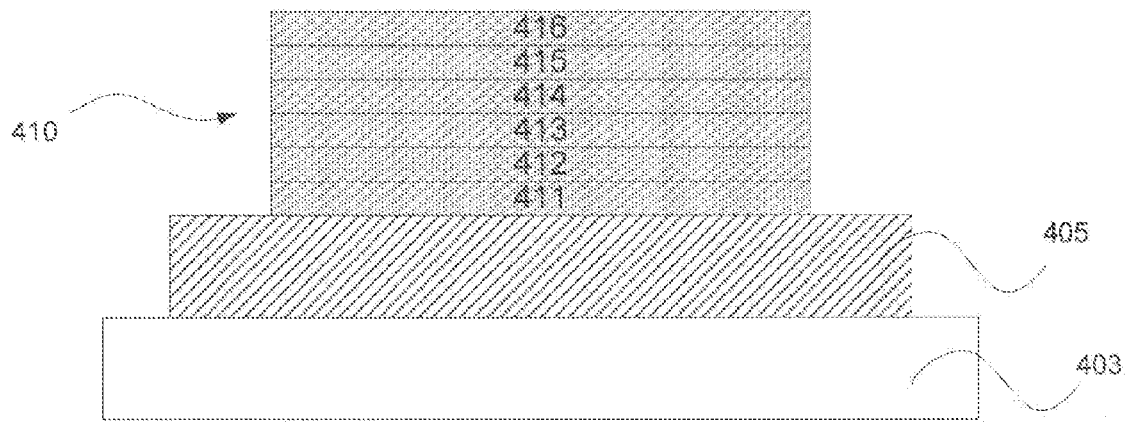
FIGS. 4A-4C illustrate the formation of a strontium titanate film by atomic layer deposition.

Multiple $TiO_2$ unit films are formed by repeating the forming of the $TiO_2$ film during an ALD supercycle at block 306 of the flowchart in FIG. 3. An ALD supercycle is when more than one unit film is layered to obtain a particular thickness of material. The plurality of $TiO_2$ unit films is illustrated in FIG. 4A as the film stack 420 that is made up of the individual $TiO_2$ unit films 421, 422, 423, and 424. FIG. 4A illustrates the $TiO_2$ film stack 420 formed over the SrO film stack 410. The number of unit films depends on the ultimate ratio of titanium to strontium desired in the final STO film. For purposes of example four unit films of $TiO_2$ are illustrated in FIG. 4A, but any number of unit films may be deposited.

In this embodiment, the total thickness of the combination of ALD supercycle to form the multiple depositions of the $TiO_2$ unit films illustrated as film stack 420 and the ALD supercycle to form multiple depositions of the SrO unit films illustrated as film stack 410. The total thickness of the SrO and $TiO_2$ layers of unit films deposited by the ALD supercycles has a thickness in the approximate range of 2 angstroms to 10 angstroms, and in some embodiments of less than approximately 5 angstroms and in a more particular embodiment the total thickness is in the approximate range of 3 angstroms and 4 angstroms. The total thickness of both film stacks 410 and 420 of the SrO and $TiO_2$ unit films was determined experimentally as those film stacks providing improved dielectric constant and leakage data, as will be described in more detail later.

Figure 4B:
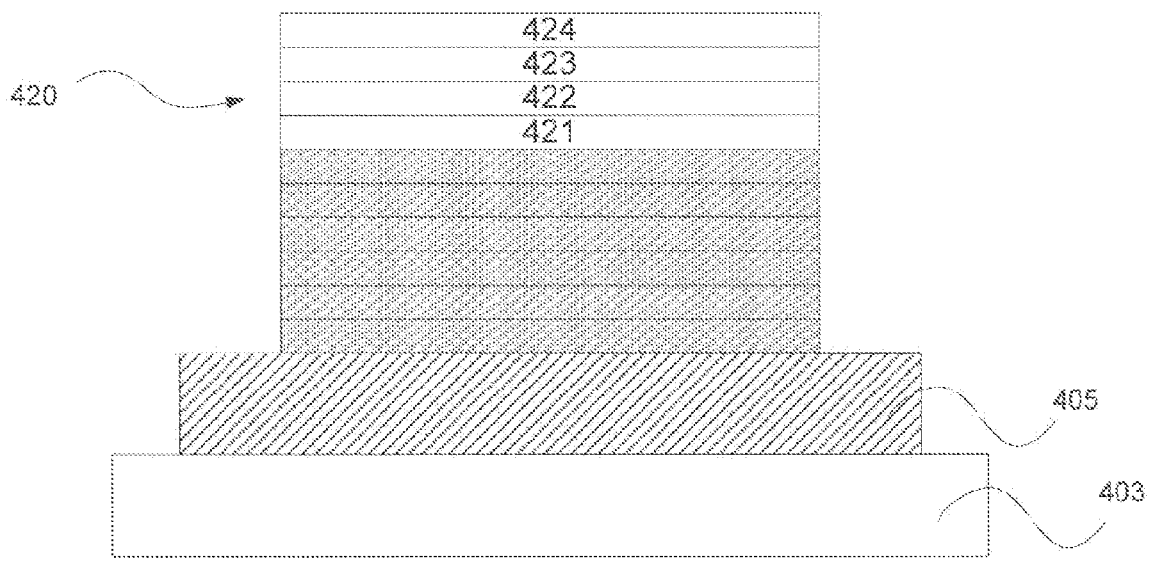

Deposition of the plurality of SrO and the plurality of $TiO_2$ unit films in multiple ALD supercycles may be repeated to ultimately form a strontium titanate film having any predetermined thickness. FIG. 4B illustrates one embodiment where only one SrO film stack and one $TiO_2$ film stack are formed, but this is not meant to be limiting. Further ALD supercycle depositions may be performed above the $TiO_2$ film stack 420, depositing SrO alternating with $TiO_2$ to build any predetermined thickness for the ultimate strontium titanate film. In an embodiment, the predetermined thickness of the strontium titanate film may be in the range of 10 nm-20 nm and more particularly approximately 15 nm. These thicknesses of the strontium titanate film were determined by the optimization of the strontium titanate film to have a high dielectric constant (k) of greater than 45 and more particularly a dielectric constant of greater than 50 and may also provide lower leakage density values, as will be shown in the Experimental Results. Additionally, in one particular embodiment, the ratio of the plurality of SrO films in film stack 410 to the plurality of $TiO_2$ films in the film stack 420 for a capacitive device may be 3:2, or any multiple of the 3:2 ratio, for example 6:4 (as illustrated in FIG. 4B) or 12:8. These ratios were experimentally determined to provide lower leakage density as measured on a completed strontium titanate film as will be shown in the Experimental Results section. The flowcharts and figures describe a strontium titanate film formed by first depositing SrO films before depositing $TiO_2$ films. This embodiment is not meant to be limiting because in an alternate embodiment a titanium oxide ($TiO_2$) film may be deposited first over the first conductive layer 405 followed by the deposition of the SrO film.

Figure 2:
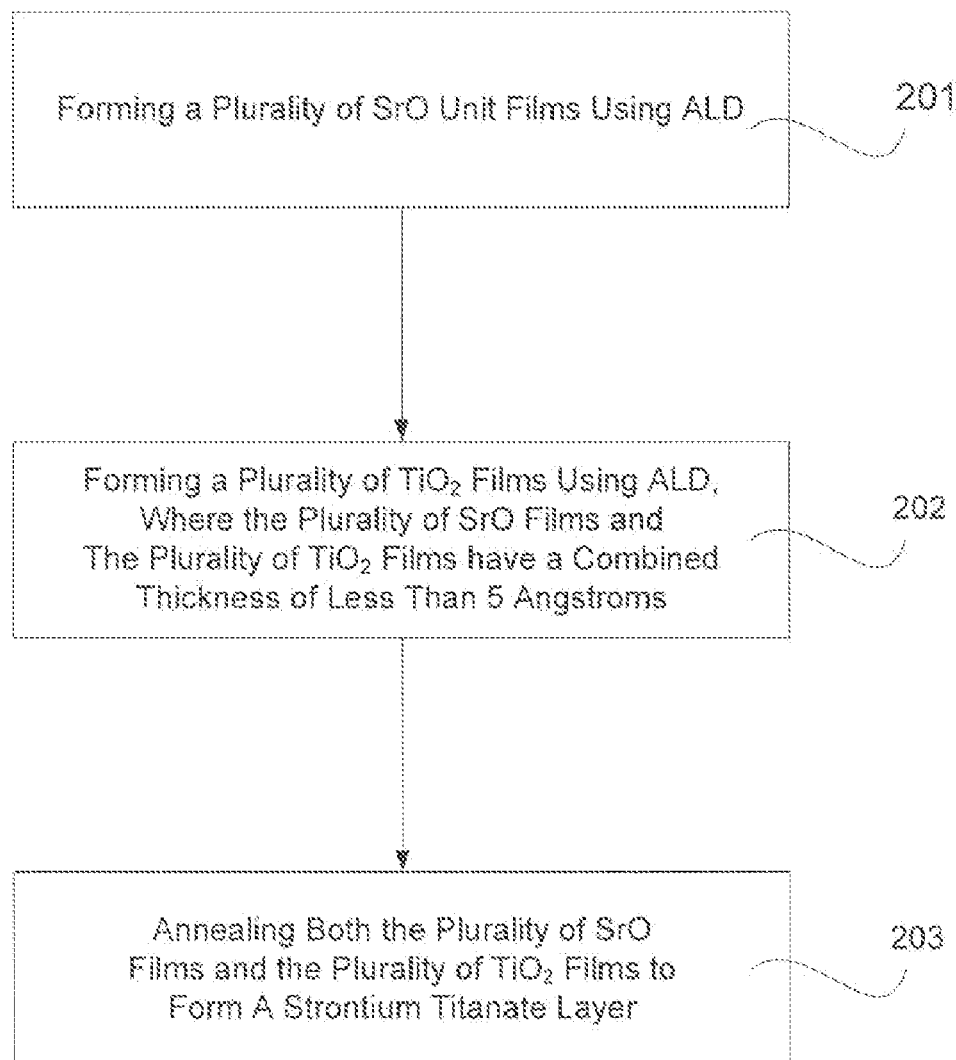
FIG. 2 is a flowchart describing a method of forming a strontium titanate layer, according to one embodiment.
Figure 4C:
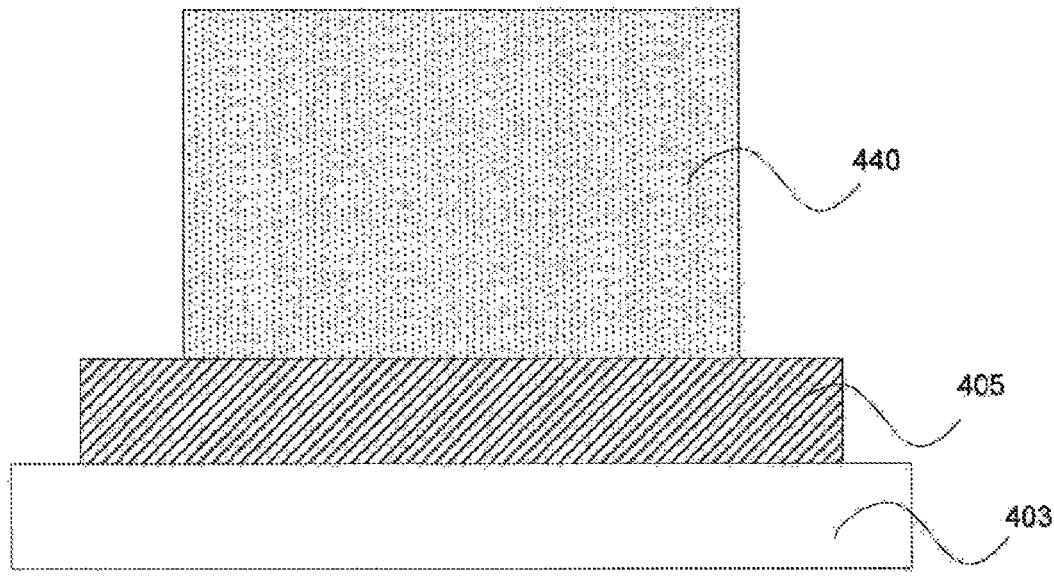

At block 203 of the flowchart in FIG. 2, both the plurality of SrO unit films (film stack 410) and the plurality of $TiO_2$ unit films (film stack 420) are annealed to form a strontium titanate (STO) layer 440 as illustrated in FIG. 4C. The annealing may be at a temperature in the approximate range of 550° C. and 700° C., and more particularly at a temperature of approximately 600° C. and 650° C. In one embodiment, represented by block 105 of FIG. 1, the annealing of the SrO film stack 410 (or film stacks) and the $TiO_2$ film stack 420 (or film stacks) may occur before forming a second conductive layer over the STO film. Experimental results show that in some embodiments annealing the SrO and $TiO_2$ film stacks may provide lower leakage density (J) and a higher dielectric constant (k) for strontium titanate films formed by this method. In an alternate embodiment, the annealing may occur after forming the second conductive layer. The ambient atmosphere in which the annealing is performed may be nitrogen gas, oxygen gas, or an inert gas. The composition of the strontium titanate layer depends on the ratio of the number of $TiO_2$ unit films to the number of SrO unit films deposited. During the ALD supercycle described above and in blocks 101 and 102 of the flowchart of FIG. 1, the forming of the $TiO_2$ unit film is repeated a first number of times and the forming of the SrO unit film is repeated a second number of times, and the ratio of the first number to the second number is selected to form a strontium titanate film having a predetermined stoichiometry. In an embodiment of the current invention, the predetermined stoichiometry may be in the approximate range of 0.48 Sr/(Sr+Ti) to 0.56 Sr/(Sr+Ti), and more particularly in the range of 0.50 Sr/(Sr+Ti) to 0.52 Sr/(Sr+Ti). In one particular embodiment, the composition is formed to have a stoichiometry of approximately 0.52 strontium in the strontium titanate film (Sr/(Sr+Ti)=0.52±0.2).

The selection of the Ti-1 and the Sr-precursor in combination with ozone may lead to less incorporation of carbon in the final strontium titanate film. It is theorized that the $TiO_2$ unit film incorporates little to no carbon because the Ti-precursor makes a clean break between the Ti—C bonds during the reaction with ozone so that the oxygen from the ozone may react only with the Ti atoms. It was unexpected that ozone would be the best oxidizer for the formation of the $TiO_2$ films using the Ti-precursor. This is because ozone is often not compatible with many Ti-precursors and, in embodiments of this invention, ozone is not only compatible with Ti-1 but also ultimately provides low carbon strontium titanate films. There may be no detectable carbon within bulk strontium titanate films formed using ozone as the oxidizer, a strontium precursor selected from the class of polydentate β-ketoiminates, and Ti-1 using the processing conditions described above. The ALD process is optimized to form a strontium titanate film having no carbon in the bulk portion of the film, where the detectable limit of carbon is an atomic percent of less than approximately 0.2. In one experiment a strontium titanate film may be formed by the annealing of an ALD supercycle nanolaminate where the number of titanium oxide layers is 10 and the number of SrO layers is 20 (Ti:Sr=10:20). This forms a film having a strontium composition of 0.60 (Sr/(Sr+Ti)) where there is no detectable carbon in the bulk strontium titanate film and a small amount of detectable carbon at the surface of the film. In another experiment, a strontium titanate film may be formed by the annealing of an ALD supercycle nanolaminate where the number of titanium oxide layers is 11 and the number of SrO layers is 20 (Ti:Sr=11:20). This forms a film having a strontium composition of 0.57 (Sr/(Sr+Ti)) where there is no detectable carbon in the bulk strontium titanate film and also no detectable carbon at the surface of the film. Therefore, it has been experimentally shown that a strontium titanate film formed by the annealing of an ALD nanolaminate can be formed with an atomic percent of carbon of 0.2 or less. The optimization of the strontium titanate film to obtain a film having an atomic percent of carbon of 0.2 or less may be accomplished through the selection of the precursors and the selection of the process conditions. Minimizing the amount of carbon in the film increases the dielectric constant of the strontium titanate film. Less carbon is theorized to improve the crystallization of the strontium titanate film into the cubic phase that maximizes the value of the dielectric constant (k).

FIG. 5 shows a chart 500 having data of the predicted atomic percent of strontium (column 501) vs. actual measured atomic percent of strontium (column 502) for multiple strontium titanate films varied by the number of $TiO_2$ unit films (Ti cycles, column 503) and SrO unit films (Sr cycles, column 504) deposited in an ALD supercycle. These experiments were conducted to not only determine the actual stoichiometry of each strontium titanate film, but also to provide strontium titanate films from which physical and electrical data could be collected. As such, the STO films represented by FIG. 5 were deposited on both $SiO_2$ and platinum (Pt) substrates. The Pt samples were used to identify the optimal supercycle thickness and the optimal supercycle ratio of $TiO_2$ to SrO unit films within the supercycle to obtain a particular atomic percent of strontium in the strontium titanate film. The study of the strontium titanate films represented by the data in chart 500 of FIG. 5 compares different variations in the ratio of the number of $TiO_2$ unit films to the number of SrO unit films within an ALD supercycle. In the first set of experiments, set #1a in row 505, the composition of the resulting strontium titanate film after annealing the film stack is the same for each experiment, but the thicknesses of the individual unit films within the ALD supercycle are varied. In the second set of experiments, set #1b in row 506, the composition of the resulting strontium titanate film is varied along with variation of the thicknesses of the unit films within the ALD supercycle. The last two sets of experiments, set #2 in row 507 and set #3 in row 508, represent extreme variations of both the unit film thicknesses in a single ALD supercycle as well as extreme variations in strontium titanate compositions.

FIG. 6A shows experimental data of the impact of the supercycle thickness on the dielectric constant of the final strontium titanate film. On the x-axis the supercycle thickness is plotted against the dielectric constant (k) of the strontium titanate film. The optimal thickness was found to be in the approximate range of 2 angstroms and 10 angstroms because the dielectric constant (k) values are the highest. Obtaining a high k value while minimizing the thickness of the strontium titanate film may be valuable in the use of strontium titanate films of the current invention as the insulator in memory devices (such as DRAM.) In FIG. 6A the impact of the ALD supercycle thickness on the dielectric constant was studied. The ALD supercycle thickness is the combination of both the $TiO_2$ and SrO unit films. FIG. 6A plots the ALD supercycle thickness in angstroms (Å) on the x-axis and the dielectric constant (k) on the y-axis of the data from set #1a in row 505 of FIG. 5. The graph shows that the highest dielectric constants (k) having values of approximately 40 and higher are provided by ALD supercycle film stacks having an ALD supercycle thickness of less than approximately 6 angstroms. These data suggest that an increase in ALD supercycle film stack thickness may cause a decrease in dielectric constant of the strontium titanate films. This graph also shows the difference in dielectric constant values for strontium titanate films having compositions of approximately 0.532 strontium and approximately 0.56 strontium.

FIG. 6B shows that the variation in the ALD supercycle film stack thickness does not impact the composition of the final resulting strontium titanate films after annealing. FIG. 6B shows x-ray crystallography data for strontium titanate films having the same ratios of $TiO_2$ unit films to SrO unit films but where the thicknesses of those unit films was varied. The strontium titanate (110) peak position did not change for any of the STO films analyzed. This result suggests that the ALD supercycle thickness does not have a significant impact on the final resulting composition of the STO films formed after annealing the ALD supercycle film stack.

FIG. 6C is a chart showing the relationship between SrO/$TiO_2$ ratio, film stack thickness, leakage density (J), effective oxide thickness (EOT), and dielectric constant (K).

The variation of composition of the strontium titanate films may have an impact on the dielectric constant (k) of the STO film. A sampling of the strontium titanate films formed according to the data provided in FIG. 5 suggest that higher amounts of strontium (Sr/(Sr+Ti)) in the strontium titanate films increases the dielectric constant. The films having a composition of approximately 0.50 Sr/((Sr+Ti) have the highest dielectric constants of above approximately 40. More specifically, the compositions of approximately 0.52±0.1 Sr/((Sr+Ti) yield a dielectric constant (k) of above 50 and more particularly a k of 54.

Figure 7:
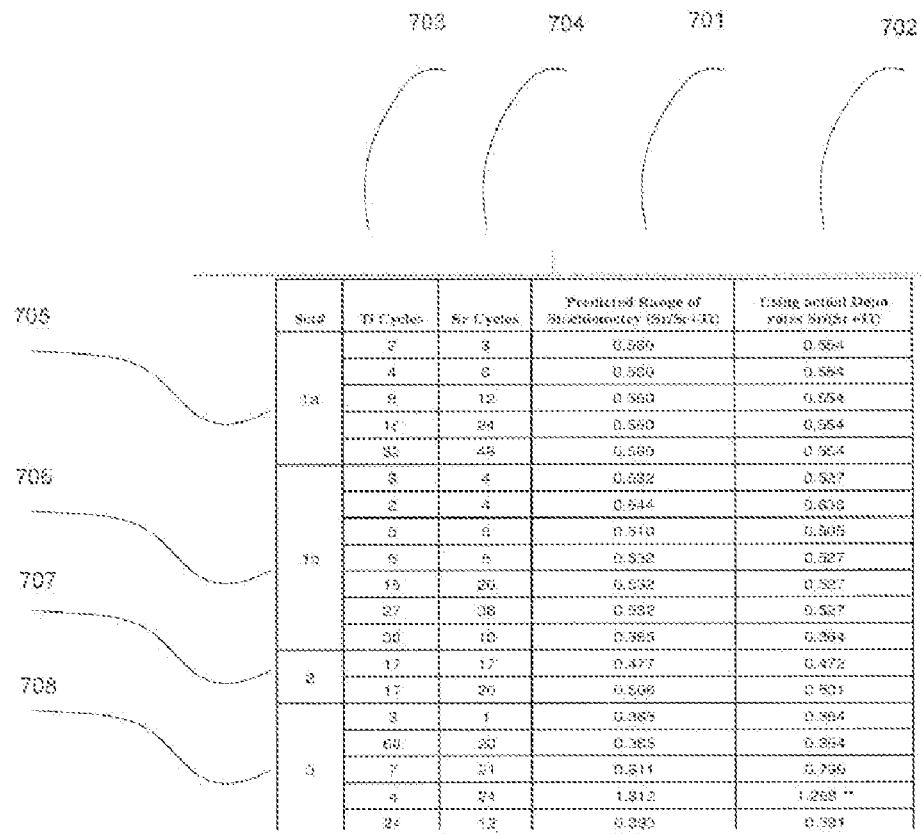
FIG. 7A is a graph showing the relationship between the strontium titanate film composition, leakage density (J), and dielectric constant (k)
FIG. 7B is a graph showing the relation ship between the strontium titanate film composition, leakage density (J), and effective oxide thickness (EOT)

FIG. 7A shows data of how the composition of the strontium titanate film effects the leakage density (J) of the strontium titanate film.

FIG. 7B shows data of how the composition of the strontium titanate film affects the effective oxide thickness (EOT) of the strontium titanate film.

FIG. 8 provides another way to look at the optimal range of supercycle film stack thicknesses and the optimal range of strontium titanate compositions. The strontium titanate composition (Sr/(Sr+Ti)) is plotted on the x-axis and the supercycle film stack thickness (angstroms) is plotted on the y-axis to form a contour plot showing an area where the dielectric constant values are optimized to be greater than 45.

Figure 9:
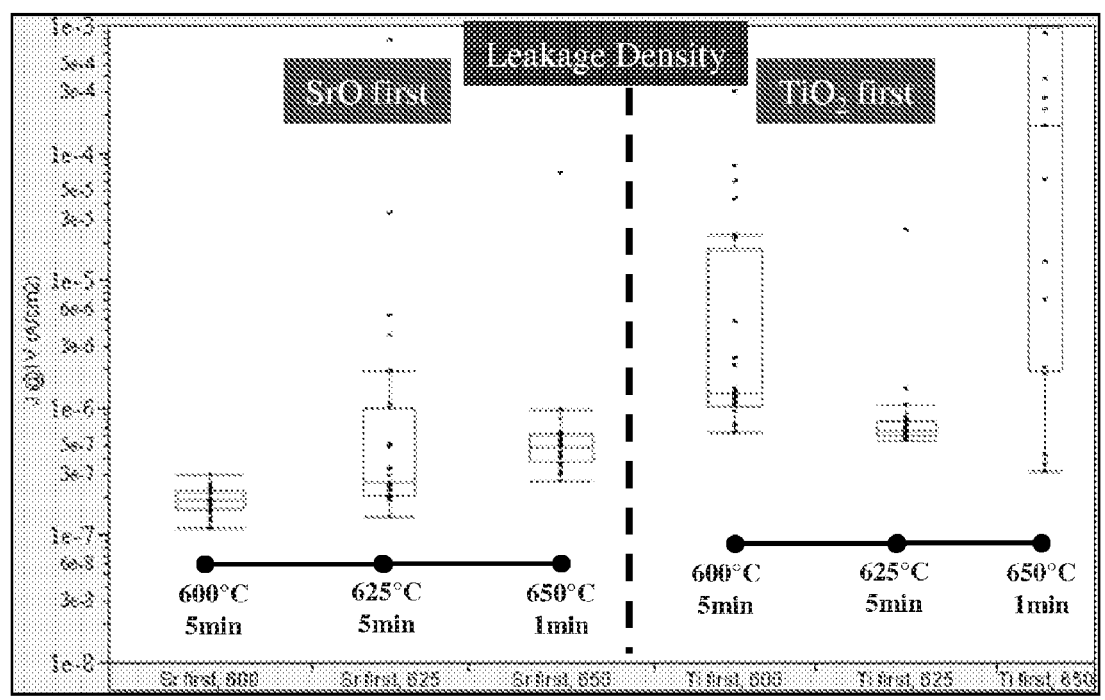
FIG. 9 is a graph comparing the leakage density of strontium titanate films (approx. 0.52 Sr/(Sr+Ti)) where strontium is deposited first to strontium titanate films where titanium is deposited first; this graph also compares strontium titanate films annealed at different temperatures and for different times.

FIG. 9: Leakage density was improved in this embodiment by depositing SrO first.

Figure 10A:
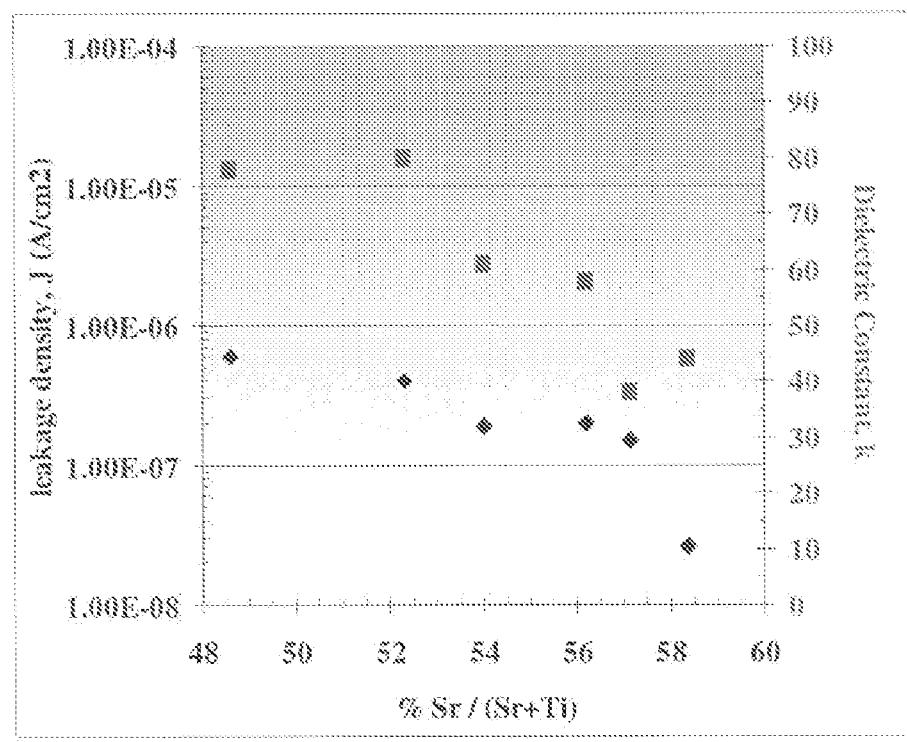
FIG. 10 is a chart comparing a strontium titanate film that was deposited by a method where 50 strontium presaturation pulses were used to a strontium titanate film that was deposited by a method where 100 strontium presaturation pulses were used.
Figure 10B:
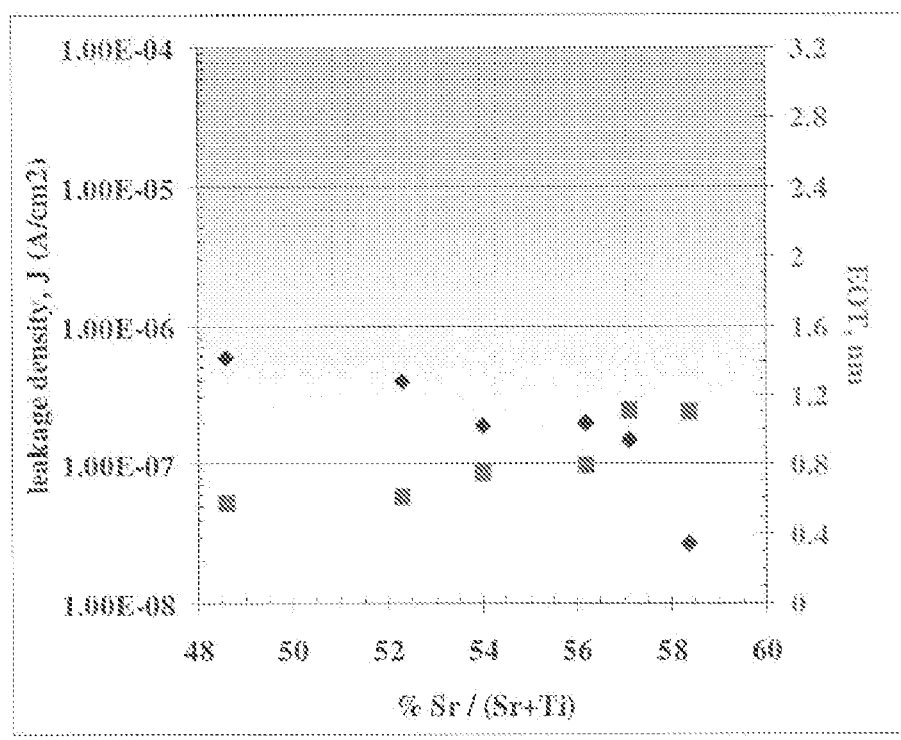
Figure 11:
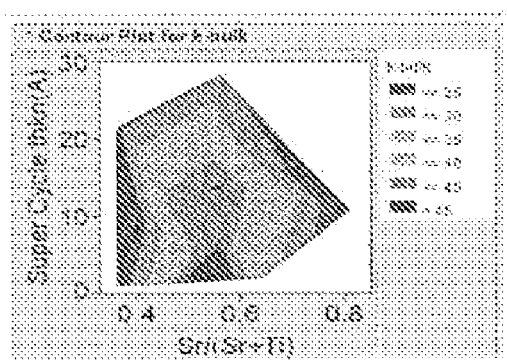
Figure 12:
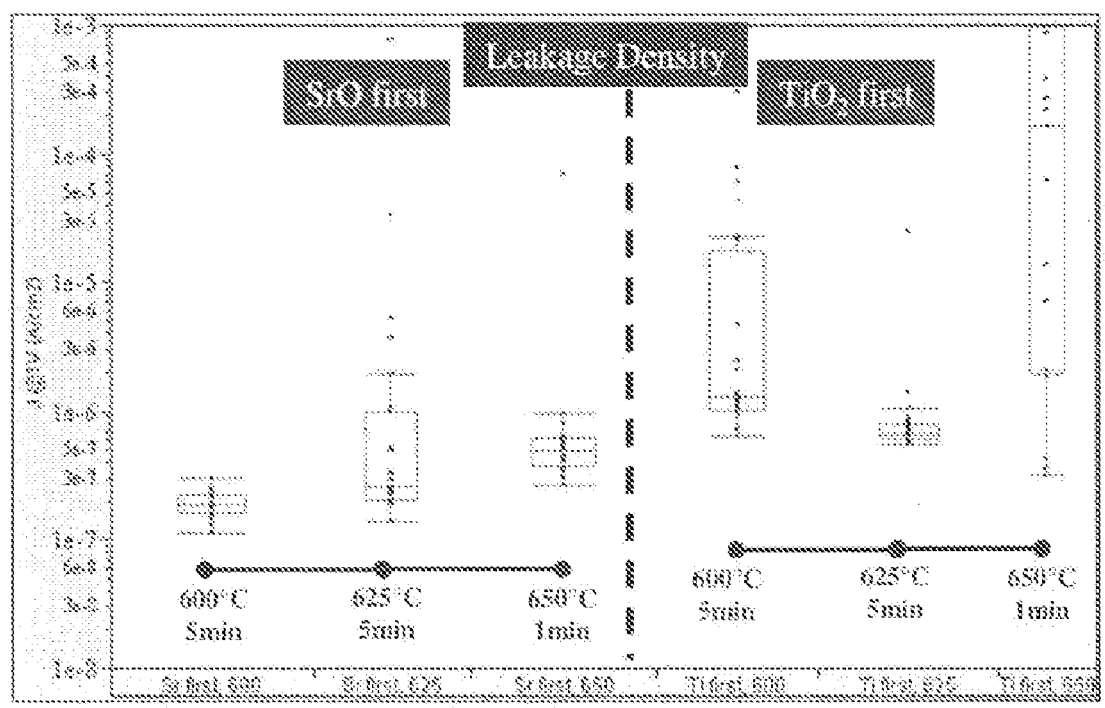

FIG. 10: Prepulsing before first deposition on the first conductive layer (electrode) improves leakage density of strontium titanate film.

Therefore, in an embodiment of the current invention based on experimental results, an optimized strontium titanate film having a dielectric constant value (k) of greater than 50 may be obtained using methodologies disclosed herein. In one particular embodiment, a strontium titanate film having a dielectric constant of greater than 50 may be formed by the annealing of an ALD supercycle nanolaminate structure having an overall thickness of approximately 15 nm. This ALD supercycle nanolaminate structure is formed by repeating the deposition of a plurality of $TiO_2$ unit films and a plurality of SrO unit films where the thickness of the $TiO_2$ and SrO unit films in a single supercycle are in the approximate range of 3 angstroms and 4 angstroms. Multiple ALD supercycles may be performed to obtain the overall thickness of an approximately 15 nm nanolaminate structure. The ratio of $TiO_2$ to SrO unit films within each of the ALD supercycles is selected to provide a strontium titanate film having approximately 52 atomic percent strontium. The combination of the supercycle thicknesses, the thickness of the ALD supercycle nanolaminate structure, and the composition of the strontium titanate film were experimentally determined, as shown by the results described earlier, to provide an optimized strontium titanate film having a k value of greater than 50.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for forming a strontium titanate film, comprising:
   a. applying between 50 and 200 pre-saturation pulses without a pulse of an oxidant between the pulses of a Sr-precursor to a substrate, wherein the substrate comprises a conductive layer;
   b. forming a Sr-containing and Ti-containing film on the substrate after applying the pulses by
      i. forming an SrO film from one or more SrO unit films;
      ii. forming a $TiO_2$ film from one or more $TiO_2$ unit films over the previously formed SrO film;
      iii. forming one or more SrO unit films over the previously formed $TiO_2$ film if the combined total thickness of all previously formed SrO films and all previously formed $TiO_2$ films has not reached a desired value;
      iv. forming one or more $TiO_2$ unit films over the previously formed SrO film if the combined total thickness of all previously formed SrO films and all previously formed $TiO_2$ films has not reached a desired value;
      v. repeating steps iii) and iv); and
   c. annealing the Sr-containing and Ti-containing film.

2. The method of claim 1 wherein the conductive layer comprises one of titanium nitride, platinum, iridium, iridium oxide, tungsten, tungsten oxide, molybdenum, molybdenum oxide, ruthenium, or ruthenium oxide.

3. The method of claim 1 wherein an oxygen containing source is one of ozone, oxygen, plasma activated oxygen, or water.

4. The method of claim 3 wherein the oxygen containing source is ozone.

5. The method of claim 1 wherein a combined total thickness of a single SrO unit film plus a single $TiO_2$ unit film is between 2 angstroms and 10 angstroms.

6. The method of claim 5 wherein a combined total thickness of a single SrO unit film plus a single $TiO_2$ unit film is between 2 angstroms and 5 angstroms.

7. The method of claim 6 wherein a combined total thickness of a single SrO unit film plus a single $TiO_2$ unit film is between 3 angstroms and 4 angstroms.

8. The method of claim 1 wherein the combined total thickness of the SrO film plus the $TiO_2$ film is between 10 nm and 20 nm.

9. The method of claim 8 wherein the combined total thickness of the SrO film plus the $TiO_2$ film is 15 nm.

10. The method of claim 1 wherein the ratio of the number of SrO unit films to the number of $TiO_2$ unit films is 3:2.

11. The method of claim 1 wherein the annealing step is performed at a temperature between 550 C and 700 C.

12. The method of claim 11 wherein the annealing step is performed at a temperature between 600 C and 650 C.

13. The method of claim 1 wherein the annealing step is performed in an atmosphere of one of nitrogen, oxygen, or inert gas.

* * * * *